United States Patent [19]

Eckert et al.

[11] 4,449,064
[45] May 15, 1984

[54] THREE STATE OUTPUT CIRCUIT

[75] Inventors: Kim Eckert; Richard D. Crisp; Lam Ta, all of Austin, Tex.

[73] Assignee: Motorola, Inc., Schaumburg, Ill.

[21] Appl. No.: 250,522

[22] Filed: Apr. 2, 1981

[51] Int. Cl.³ .................. H03K 19/094; H03K 19/017
[52] U.S. Cl. ...................................... 307/473; 307/270
[58] Field of Search ............... 307/270, 279, 450, 464, 307/448, 473, 290, 247 R, 584, 445

[56] References Cited

U.S. PATENT DOCUMENTS

| | | | |
|---|---|---|---|
| 3,697,775 | 10/1972 | Kane | 307/247 R X |
| 3,742,253 | 6/1973 | Kronies | 307/445 X |
| 3,912,947 | 10/1975 | Buchanan | 307/270 X |
| 4,217,502 | 8/1980 | Suzuki et al. | 307/270 X |
| 4,380,706 | 4/1983 | Au | 307/473 |

Primary Examiner—Larry N. Anagnos
Assistant Examiner—David R. Bertelson
Attorney, Agent, or Firm—Anthony J. Sarli, Jr.; James L. Clingan, Jr.; Robert L. King

[57] ABSTRACT

A three state output circuit which pulls down the output node thereof to a first supply voltage in response to an assert signal, pulls up the output node to a second supply voltage in response to a rescind signal, and then presents a high impedance on the output node immediately after the output node is pulled up to a selected reference voltage.

9 Claims, 2 Drawing Figures

THREE STATE OUTPUT CIRCUIT

BACKGROUND OF THE INVENTION

1. Field of the Invention

This invention relates generally to digital output circuits and, more particularly, to a three state output circuit.

2. Prior Art Statement

Digital output circuits typically respond to an input signal by coupling an output line to a high reference voltage via an active pull up device when the input signal is in a first logic state, or by coupling the output line to a low reference voltage via an active pull down device when the input signal is in a second logic state. In addition, three state output circuits respond to a three state control signal by disabling both the active pull up and pull down devices when the control signal is active, to present a high impedance on the output line. However, such circuits require additional components to generate the three state control signal. In addition, additional passive devices may be required between the output line and a selected one of the reference voltages to assure that the voltage on the output line will be passively pulled to the selected reference voltage whenever an active device is not actively pulling it to the other reference voltage.

SUMMARY OF THE INVENTION

An object of the present invention is to provide a digital output circuit which automatically presents a high impedance on an output line immediately after pulling the voltage on the output line to a selected reference voltage.

This and other objects are achieved by the present invention by providing an active pull down device which couples the output line to a low reference voltage in response to an assert signal on an input line, and an active pull up device which couples the output line to a high reference voltage in response to a rescind signal on the input line, but only until the voltage on the output line exceeds a predetermined threshold voltage.

DESCRIPTION OF THE PREFERRED EMBODIMENT

Figure 1:
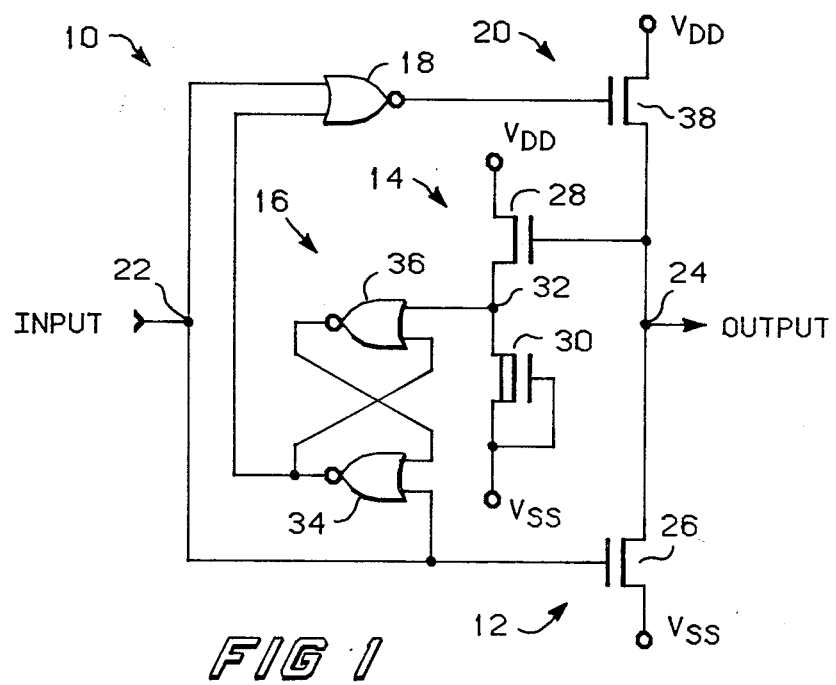
FIG. 1 is a schematic diagram of one preferred embodiment of the output circuit of the present invention.

Shown in FIG. 1 is one preferred embodiment of a digital output circuit 10 constructed in accordance with the present invention. The output circuit 10 is comprised generally of a pull down device 12, a threshold detector 14, a latch 16, a gate 18, and a pull up device 20.

The active pull down device 12 is coupled to an input node 22 and to an output node 24, and is constructed to couple the output node 24 to a low reference voltage Vss in response to an active high assert signal on the input node 22. In the illustrated form, the active pull down device 12 is an enhancement type transistor 26 having the drain thereof coupled to the output node 24, the gate thereof coupled to the input node 22, and the source thereof coupled to the low reference voltage Vss. In this configuration, the transistor 26 couples the output node 24 to the low reference voltage Vss when the assert signal applied to the input node 22 is active (i.e. high).

The threshold detector 14 is coupled to an output node 24, and provides an active high reset signal in response to the voltage on the output node 24 exceeding a predetermined threshold voltage. In the illustrated form, the threshold detector 14 comprises a transistor 28 of the enhancement type, and a transistor 30 of the depletion type. The transistor 28 has the drain thereof coupled to a high reference voltage Vdd, the gate thereof coupled to the output node 24, and the source thereof coupled to a node 32. The transistor 30 has the drain thereof coupled to the node 32, and the gate and source thereof coupled to the low reference voltage Vss. In this configuration, the transistor 30 operates like a resistor to passively pull the node 32 toward Vss, while the transistor 28 operates to actively pull the node 32 toward Vdd only when the voltage on the output node 24 exceeds the threshold voltage Vt of the transistor 28.

The latch 16 is coupled to the input node 22 and to the threshold detector 14, and provides an active low enable signal in response to the assert signal applied to the input node 22. Even after the assert signal goes inactive, the latch 16 will inactivate the enable signal only in response to the reset signal. In the illustrated form, the latch 16 comprises a pair of conventional, cross-coupled NOR gates 34 and 36, with the set input of the gate 34 coupled to the input node 22 and the reset input of the gate 36 coupled to the threshold detector 14 at the node 32. In this configuration, the gate 34 is dominant so that the reset signal developed on the node 32 by the threshold detector 14 will be effective only when the assert signal on the input node 22 is inactive (i.e. low).

The gate 18 is coupled to the input node 22 and to the latch 16, and passes an active low rescind signal applied to the input node 22, in response to the coincidence of the rescind signal and the enable signal. In the illustrated form, the gate 18 comprises a conventional NOR gate with one input coupled to the input node 22 and the other input coupled to the latch 16 at the output of the gate 34. In this configuration, the gate 18 replicates the active low rescind signal, but in an active high form, when the enable signal is active (i.e. low).

The active pull up device 20 is coupled to the gate 18 and to the output node 24, and is constructed to couple the output node 24 to the high reference voltage Vdd in response to the rescind signal passed by the gate 18. In the illustrated form, the active pull up device 20 is an enhancement type transistor 38 having the drain thereof coupled to the high reference voltage Vdd, the gate thereof coupled to the output of the gate 18, and the source thereof coupled to the output node 24. In this configuration, the transistor 38 couples the output node 24 to the high reference voltage Vdd when the rescind signal applied to the gate thereof by the gate 18 is active (i.e. high).

Figure 2:
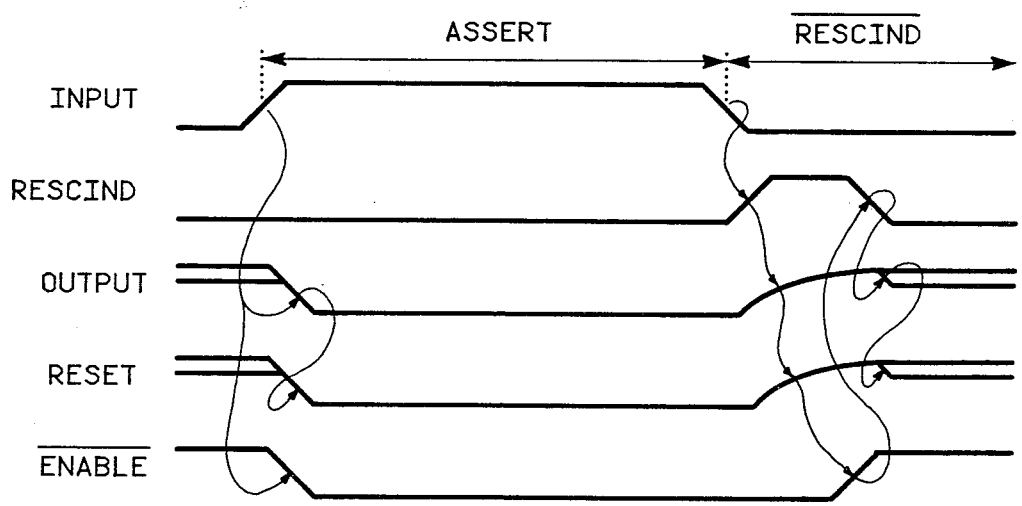
FIG. 2 is a timing diagram illustrating the operation of the circuit of FIG. 1.

In the typical operational sequence illustrated in FIG. 2, a control circuit (not shown) will initially provide the assert signal in the active state as a high on the input node 22. With a high voltage on the gate thereof, the transistor 26 will turn on, rapidly pulling the output node 24 low. Simultaneously, the latch 16 will be set, so that the enable signal becomes active (i.e. low). As soon as the voltage on the output node 24 drops below the threshold voltage Vt of the transistor 28, the reset signal on the node 32 will become inactive (i.e. low).

When the control circuit (not shown) thereafter provides the rescind signal in the active state as a low on the input node 22, the transistor 26 will turn off. The latch 16, however, will remain set because the reset signal is still inactive. Since the enable signal and the rescind signal are now both active, gate 18 is enabled and provides the active high form of the rescind signal in the active state (i.e. high). With a high voltage on the gate thereof, the transistor 38 will turn on, rapidly pulling the output node 24 toward the high reference voltage Vdd. As soon as the voltage on the output node 24 exceeds the threshold voltage Vt of the transistor 28, the transistor 28 turns on, overpowering the transistor 30 and driving the reset signal active (i.e. high). With the assert signal inactive and the reset signal active, the latch 16 resets, driving the enable signal inactive (i.e. high). In response to the inactive enable signal, the gate 18 provides the active high form of the rescind signal in the inactive state (i.e. low). The transistor 38 will thus turn off.

Once both transistor 26 and transistor 38 are off, the output circuit 10 will present a relatively high impedance on the output node 24. This high impedance state allows other control circuits (not shown) to communicate via the output node 24 using similar output circuits 10. Note, however, that each output circuit 10 rapidly restores a high voltage on the node 24 before going into the high impedance state. As a result, the delay time normally associated with passive pull up of a bus line to which the output node 24 may be coupled is significantly reduced.

Although the input signal has been described and shown in the form of a single signal coupled to the input node 22, a latch, similar to the latch 16, may be provided to develop the assert and rescind signals on the input node 22 in response to discrete assert and rescind signals applied to the set and reset inputs thereof. Various other changes may be made to the construction and arrangement of the parts or elements of the preferred embodiment disclosed herein without departing from the spirit and scope of the present invention as defined in the appended claims.

We claim:

1. A three state output circuit comprising:
   active pull down means coupled to an input node and an output node, for coupling the output node to a first supply voltage in response to an assert signal having a first predetermined voltage level;
   threshold detection means coupled to the output node, for providing a reset signal in response to the voltage on the output node exceeding a predetermined threshold voltage;
   latch means coupled to the input node and the threshold detection means, for providing an enable signal in response to said assert signal, and, in the absence of said assert signal, terminating said enable signal in response to said reset signal;
   gate means coupled to the input node and the latch means, for passing a rescind signal having a second predetermined voltage level in response to the coincidence of said rescind signal and said enable signal; and
   active pull up means coupled to the gate means and the output node, for coupling the output node to a second supply voltage in response to said rescind signal passed by the gate means.

2. The circuit of claim 1 wherein the latch means has a set input coupled to the input node, a reset input coupled to the threshold detector, and an output coupled to the gate means.

3. The circuit of claim 2, wherein the latch means comprises a pair of cross-coupled NOR gates.

4. The circuit of claim 2 wherein the output of the latch means is dominated by the assert signal coupled to the set input thereof.

5. The circuit of claim 2 wherein the threshold detector comprises:
   first means for passively pulling the reset input of the latch means towards the first reference voltage; and
   second means for actively pulling the reset input of the latch means towards the second reference voltage when the voltage on the output node exceeds the predetermined threshold voltage, the second means being capable of overpowering the first means.

6. The circuit of claim 5 wherein the first means comprises a depletion type transistor having the gate and source thereof coupled to the first reference voltage, and the drain thereof coupled to the reset input of the latch means; and wherein the second means comprises an enhancement type transistor capable of conducting more current than said depletion transistor and having the source thereof coupled to the reset input of the latch means, the drain thereof coupled to the second reference voltage, and the gate thereof coupled to the output node, the threshold voltage of the enhancement transistor establishing said predetermined threshold voltage.

7. The circuit of claim 1 wherein the pull down and the pull up devices are enhancement type transistors.

8. The circuit of claim 1 wherein said gate means comprises a NOR gate.

9. A three state output circuit comprising:
   active pull down means responsive to an assert signal having a first predetermined voltage level, for coupling an output node to a first supply voltage in response to said assert signal;
   threshold detection means responsive to the voltage on said output node, for providing a reset signal in response to the voltage on said output node exceeding a predetermined threshold voltage;
   latch means responsive to said assert signal and said reset signal, for providing an enable signal in response to said assert signal, and, in the absence of said assert signal, terminating said enable signal in response to said reset signal;
   gate means responsive to said enable signal and a rescind signal having a second predetermined voltage level; for passing said rescind signal in response to the coincidence of said rescind signal and said enable signal; and
   active pull up means responsive to said rescind signal passed by said gate means, for coupling said output node to a second supply voltage in response to said rescind signal passed by said gate means.

* * * * *